(12) United States Patent
Barabasi et al.

(10) Patent No.: US 6,469,880 B1
(45) Date of Patent: Oct. 22, 2002

(54) REDUCING VORTEX DENSITIES AND TRANSPORTING VORTICES IN SUPERCONDUCTORS

(75) Inventors: Albert-Laszlo Barabasi, South Bend, IN (US); Boldizsar Janko, Chicago, IL (US); Choongseop Lee, Notre Dame, IN (US); Imre Derenyi, Chicago, IL (US)

(73) Assignee: University of Notre Dame, Notre Dame, IN (US)

( * ) Notice: Subject to any disclaimer, the term of this patent is extended or adjusted under 35 U.S.C. 154(b) by 0 days.

(21) Appl. No.: 09/531,646

(22) Filed: Mar. 21, 2000

Related U.S. Application Data
(60) Provisional application No. 60/125,706, filed on Mar. 23, 1999.

(51) Int. Cl.[7] .................................................. H02H 7/00
(52) U.S. Cl. ........................... 361/19; 361/115; 361/143
(58) Field of Search ............................. 361/19, 115, 143

(56) References Cited

U.S. PATENT DOCUMENTS 5,986,453 A  * 11/1999 Anderson et al. ........... 324/300

OTHER PUBLICATIONS

Falo et al., "Ratchet Potential For Fluxons In Josephson–Junction Arrays", Mar. 15, 1999, *Europhysics Letters*, pp. 700–706.

Robilliard et al., "Ratchet For Cold Rubidium Atoms: The Asymmetric Optical Lattice", Jan. 25, 1999, *Physical Review Letters*, pp. 851–854.

Linke et al., "A Quantum Dot Ratchet: Experiment And Theory", Nov. 1, 1998, *Europhysics Letters*, pp. 343–349.

Derenyi et al., "Ratchet Effect In Surface Eletromigration: Smoothing Surfaces By An AC Field", Feb. 16, 1998, pp. 1473–1476.

Slater et al., "Bidirectional Transport Of Polyelectrolytes Using Self–Modulating Entropic Ratchets", Feb. 10, 1997, *Physical Review Letters*, pp. 1170–1173.

Zapata et al., "Voltage Rectification By A SQUID Ratchet", Sep. 9, 1996, *Physical Review Letters*, pp. 2292–2295.

* cited by examiner

Primary Examiner—Stephen W. Jackson
(74) Attorney, Agent, or Firm—Michael D. Rechtin; Foley & Lardner

(57) ABSTRACT

A system and method for removing unwanted magnetic flux from a superconductor. A device can generate a controllable electric field potential using an asymmetric electric field potential to efficiently remove the magnetic flux in different directions in the superconductor.

14 Claims, 3 Drawing Sheets

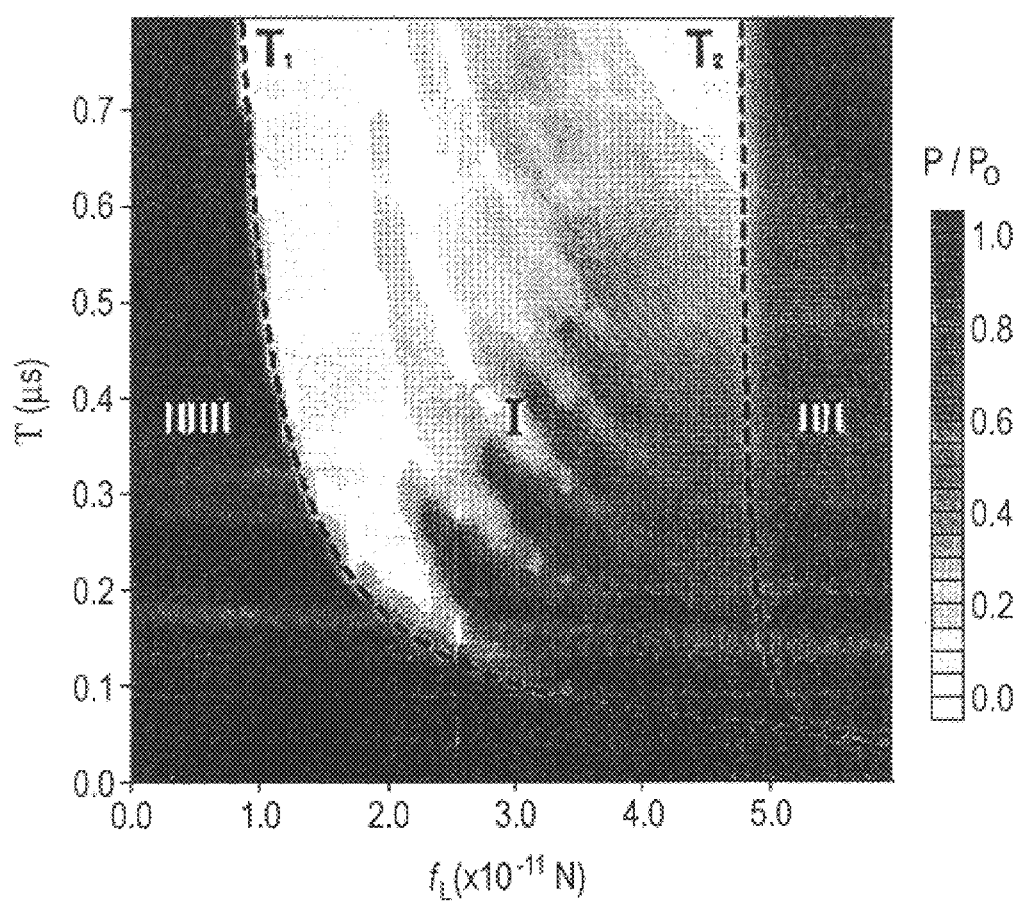

REDUCING VORTEX DENSITIES AND TRANSPORTING VORTICES IN SUPERCONDUCTORS

This is a nonprovisional application based in part on a previously filed provisional application, Ser. No. 60/125,706, filed Mar. 23, 1999, of which the benefit of priority is claimed.

The present invention relates generally to a method and system for transport and removal of trapped magnetic flux, or vortices, in a superconductor device. More particularly, the invention is directed to a method and system for application of an AC current to a superconductor to induce motion of vortices and cause their substantial removal from a superconductor.

A serious obstacle that impedes the utilization of low and high temperature superconductor devices is the presence of trapped flux. Flux lines or vortices are induced by fields as small as the Earth's magnetic field. Once present in a superconductor, vortices dissipate energy and generate internal noise, limiting the operation of numerous superconducting devices. Prior methods used to overcome this difficulty include the pinning of vortices by the incorporation of impurities and defects, the construction of flux dams, slots and holes and also the use of magnetic shields which block the penetration of new flux lines in the bulk of the superconductor or reduce the magnetic field in the immediate vicinity of the superconducting device. The most desirable result would be to remove the vortices from the bulk of the superconductor. There is currently no known phenomenon or process, however, that could form the basis for such a result.

It is therefore an object of the invention to provide an improved method and system for producing superconductors with enhanced properties.

It is another object of the invention to provide a novel method and system for removal of unwanted magnetic flux trapped in a superconductor.

It is yet a further object of the invention to provide an improved method and system for removal of magnetic vortices in a superconductor by application of an AC field.

It is also an object of the invention to provide an improved method and system for application of a particular AC potential to a superconductor to sweep magnetic vortices out of the superconductor.

It is an additional object of the invention to provide a novel method and system for generating a patterned potential field designed to remove a magnetic flux from a superconductor.

In the present invention, the application to a superconductor of an AC current that is patterned with an asymmetric pinning potential can induce vortex motion whose direction is determined only by the asymmetry of the pattern. This vortex motion can result in their substantial removal from the superconductor. The mechanism responsible for this phenomenon is the well-known ratchet effect, and its working principle applies to both low and high temperature superconductors. We demonstrate that with an appropriate choice of the pinning potential, the ratchet effect can be used to remove vortices from superconductors in the parameter range required for various applications.

The features of the present invention which are believed to be novel are set forth with particularity in the appended claims. The invention, together with the objects and advantages thereof are best understood by reference to the following description taken in conjunction with the accompanying drawings. Provisional Application Ser. No. 601125,706 is also incorporated by reference herein.

BRIEF DESCRIPTION OF THE DRAWINGS

FIG. 3B illustrates effectiveness of vortex removal via a plot of reduced vortex density as a function of Lorentz force and time period, T, of the current.

DETAILED DESCRIPTION OF PREFERRED EMBODIMENTS

Figure 1A:
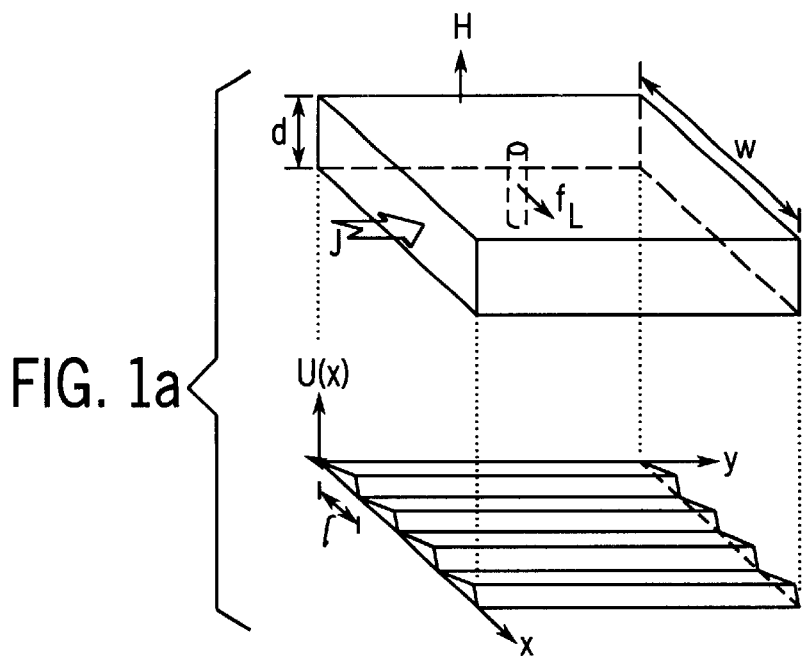
FIG. 1A shows a superconducting film placed in an external magnetic field, H.
Figure 1B:
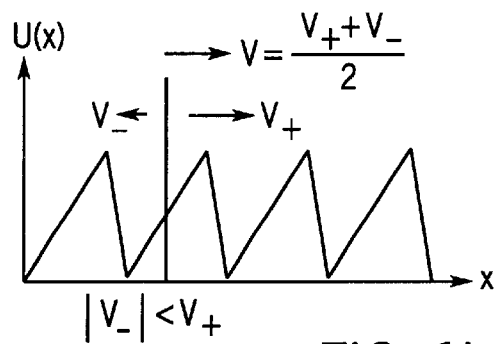
FIG. 1B shows a sample, patterned potential applied having an asymmetric sawtooth potential.

As an illustration of one embodiment of the invention, consider a type II superconductor film of the geometry shown in FIG. 1A, which is placed in an external magnetic field H. As shown in FIG. 1A, the superconductor is patterned with an asymmetric pinning potential $U(x,y)=U(x)$ which is periodic with period 1 along the x direction. The potential has an asymmetric shape within one period, and is transitionally invariant along the y direction of the sample. A DC current with density J flowing along the y direction (indicated by the large arrow) induces a Lorentz force $f_L$ that moves the vortex in the x direction. The method used to generate the potential can include, but is not limited to, patterning during growth, lithography, and stamping (both resulting in thickness variations) and irradiation. The potential preferably has the following properties: it should be asymmetric, and one of the simplest examples of an asymmetric periodic potential is an asymmetric sawtooth potential shown in FIG. 1B. Other asymmetric potentials can also be used to achieve the desired difference in vortex velocity described herein. In FIG. 1B the solid arrows indicate the vortex velocity $v_+(v_-)$ induced by a direct $+J$ (reversed $-J$) current. The average, $v=(v_+ + v_-)/2$, is the ratchet velocity of the vortex, obtained when an AC current is applied. In the presence of a current with density J flowing along the y axis the vortices move with the velocity:

$$v=(f_L+f_{vv}+f_u)/\eta \qquad (1)$$

where $f_L=(J+\hat{h})\Phi_0 \, d/c$ is the Lorentz force moving the vortices transverse to the current, $\hat{h}$ is the unit vector pointing in the direction of the external magnetic field H, $$f_u = -\frac{dU}{dx}\hat{x}$$

is the force generated by the periodic potential, $f_{vv}$ is the repulsive vortex-vortex interaction, $\Phi_0$ is the flux quantum, $\eta$ is the viscous drag coefficient and d is the length of the vortices (i.e., the thickness of the sample in the example shown).

When a DC current flows along the y direction, the Lorentz force moves the vortices along the positive x direction with velocity $v_+$. Reversing the current reverses the direction of the vortex velocity, but its magnitude, $|v-|$, due to the asymmetry of the potential, is different from $v_+$. For the sawtooth potential shown in FIG. 1B the vortex velocity is higher when the vortex is driven to the right, than when it is driven to the left ($v_+>|v_-|$). As a consequence of this, the application of an AC current (which is the consecutive application of direct, +J, and reverse, −J, currents) results in a net velocity $v=(v_+ + v_-)/2$ which is to the right in FIG. 1B. This net velocity induced by the combination of an asymmetric potential and an AC driving force is called ratchet velocity. The ratchet velocity for the case of low vortex density (when vortex-vortex interactions are neglected) can be determined analytically. Assuming that the AC current alternates between +J and −J with period T, in the T→∞ limit the ratchet velocity of the vortices is given by the expression:

$$v = \begin{cases} 0 & \text{if } f_L < f_1 \\ \dfrac{1}{2\eta} \dfrac{(f_x + f_2)(f_L - f_1)}{f_L + f_2 - f_1} & \text{if } f_1 < f_L < f_2 \\ \dfrac{1}{\eta} \dfrac{f_1 f_2 (f_2 - f_1)}{f_L^2 - (f_2 - f_1)^2} & \text{if } f_2 < f_L, \end{cases} \quad (2)$$

where $f_1 = \Delta U/l_1$ and $f_2 = \Delta U/l_2$ are the magnitudes of the forces generated by the ratchet potential on the facets of length $l_1$ and $l_2$, respectively (see FIG. 1C), $\Delta U$ is the energy difference between the maximum and the minimum of the potential, and $f_L = |f_L| = J\Phi_0$ d/c.

In high magnetic fields vortex-vortex interactions play an important role, and thus we have performed molecular dynamics simulations to determine the ratchet velocity for a collection of vortices. As FIG. 2 demonstrates, we find that for low vortex densities the numerical results follow closely the analytical prediction of Eqn. (2), and the magnitude of the ratchet velocity decreases with increasing vortex density. The vortex densities used in the simulations correspond to an internal magnetic field of 0.7, 35, and 70 G, covering a wide range of magnetic fields. A key question for commercial applications is whether the ratchet velocity of Eqn. (2) is large enough to induce observable vortex motion at experimentally relevant time scales. To address this issue in FIG. 2, as described hereinbelow, v was plotted for Nb, a typical low temperature superconductor used in a wide range of devices, for which the potential U(x) is induced by thickness variations of the superconductor.

Figure 2:
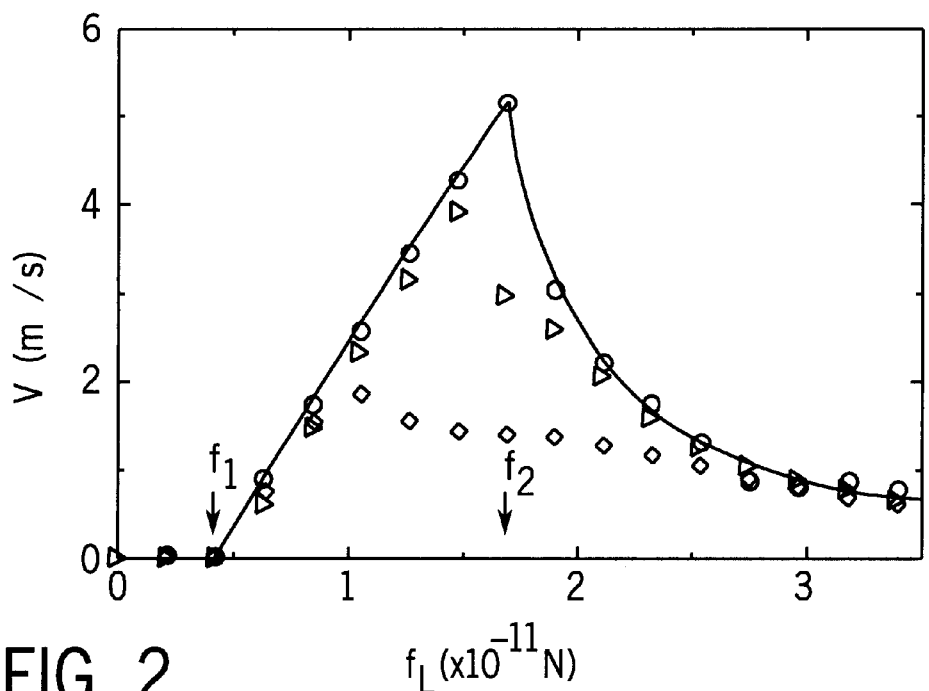
FIG. 2 illustrates a comparison between an analytical calculation versus molecular dynamics simulations of ratchet velocity for a collection of magnetic vortices.

In FIG. 2 the ratchet velocity of the vortices is shown as a function of the amplitude of the driving force $f_L$. The thick solid line corresponds to the analytical result of Eqn. (2) for a single vortex line. The symbols are the result of the numerical simulations for multiple vortices. The simulations were done using a conventional, well known model assuming that the rigid vortices are pointlike objects moving in the x-y plane. At time zero the vortices are positioned randomly in the superconductor with a density $\rho$, and they move with velocity given by Eqn. (1). The vortex-vortex interaction between two vortices at position $r_i$ and $r_j$ is modeled using Eqn. (1):

$$f_w = \frac{\phi_0^2 d}{8\pi^2 \lambda^3} K_1((r_i - r_j)/\lambda) \hat{r}_{ij}$$

where, $\hat{r}_{ij} = (r_i - r_j)/|r_i - r_j|$.

Figure 1C:
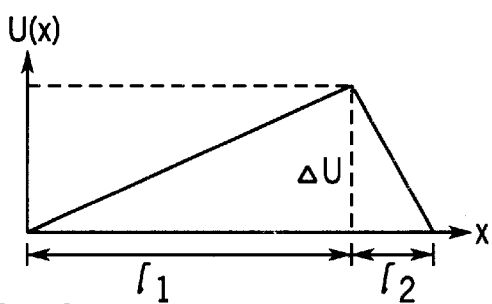
FIG. 1C shows change of potential along both patterned potential, triangle facets for one cycle of the sawtooth potentials of FIG. 1B.

Here the modified Bessel function $K_1$ is cut off beyond the distance $r=25\lambda$, where $\lambda$ is the penetration depth (for Nb $\lambda=45$ nm at T=0). The force $f$ generated by the sawtooth pinning potential shown in FIGS. 1B and 1C is equal to $f_1$ when $kl < x < kl+l_1$, and $f_2$ when $kl+l_1 < x < (k+1)l$, where $k=0, 1, \ldots, N-1$. We choose $l_1 = 20\lambda = 0.9$ $\mu$m, $l_2 = 5\lambda = 0.225$ $\mu$m, $l = l_1 + l_2$ and N=10, giving for the total width of the sample w=11.25 $\mu$m. Its length (along the y direction) is set to 12 $\mu$m. The sample has periodic boundary conditions in both the x and y direction. The Lorentz force due to the AC current is equal to $+f_L$ for T/2 time, and $-f_L$ for T/2 using T=0.3 $\mu$s. The simplest case was considered, in which the potential is induced by thickness variations of a Nb superconductor thin film of thickness d, i.e., the superconductor thickness, d+h(x), changes along the x direction, following a sawtooth pattern. The pinning energy acting on the vortices is given by $U(x) = (d+h(x))\epsilon_0$, where $\epsilon_0$ is the line energy of the vortex per unit length. Thus, the magnitudes of the forces acting on the vortices are $f_1 = \epsilon_0 \Delta h/l_1$ and $f_2 = \epsilon_0 \Delta h/l_2$ for the two facets of the $\Delta h$ high teeth (shown in FIG. 1C), and we choose $\Delta h = l_2$. For Nb we have $\epsilon_0 = 1.7 \times 10^{-11}$ N, the viscosity per unit length is $\eta_0 = 7 \times 10^{-6}$ Ns/m$^2$, yielding $\eta = \eta_0 d = 1.4 \times 10^{-12}$ Ns/m for a d=2000 Å thick film. The total number of vortices in the simulation were n=5(○), n=250(▷), and n=500(◇) corresponding to ≈0.7G(○), 35G(▷), and 70G(◇) magnetic fields in the sample.

Consequently, as FIG. 2 indicates, the maximum ratchet velocity of 5.2 m/s is high enough to move a vortex across the typical few micrometer wide sample in a few microseconds. Furthermore, increasing the vortex densities by two orders of magnitude decreases the vortex velocity only by a factor of three.

Figure 3A:
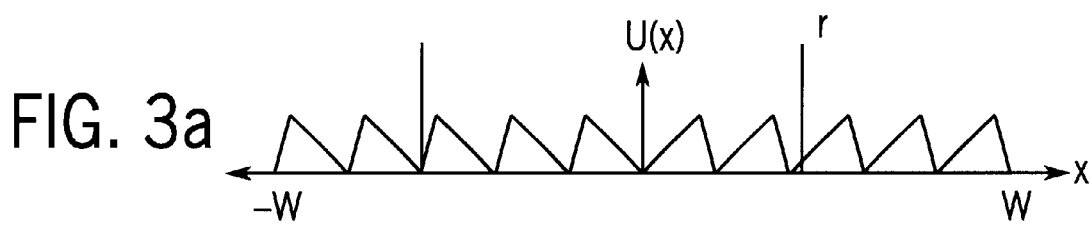
FIG. 3A illustrates a pattern of two arrays of ratchet potentials.

The potentially useful applications of the ratchet effect can be shown generally by demonstrating that it can be used to drive vortices out of a superconductor. Consider a superconductor film that is patterned with two arrays of ratchet potentials, as shown in FIG. 3A. During the application of the AC current, the asymmetry of the potential in the right half moves the vortices in that region to the right, while vortices in the left half move to the left. Thus, the vortices drift towards the closest edge of the sample, decreasing the vortex density in the bulk of the superconductor. Further details are described herinafter. In FIG. 3B is summarized the effectiveness of vortex removal by plotting the reduced vortex density inside the superconductor as a function of the Lorentz force $f_L$ and the period T of the current. One can see there is a well-defined region where the vortex density drops to zero inside the superconductor, indicating that the vortices are completely removed from the bulk of the superconductor. Outside this region we observe either a partial removal of the vortices, or the AC current has no effect on the vortex density.

Using the simulation method illustrated in FIG. 2, a system was investigated which consisted of N=5 teeth oriented to the left and the same number oriented to the right. As shown in FIG. 3A, the parameters of each tooth are identical to that described in FIG. 1C. To mimic the pressure generated by the external magnetic field, which acts to push vortices into the superconductor, we attached two reservoirs on the two sides. The reservoirs have a constant vortex density $\rho_0$ at all times. Thus, vortices can leave the superconductor for the reservoir, or new vortices can enter from the reservoir. In thin superconductor films, due to the Meissner current, there is a geometrical barrier that acts to trap the vortices inside the superconductor. Since most applications of superconductors involve thin films, we included in the simulations this geometrical barrier, that creates a force $$f_{in}(x) = -\frac{H\phi_0}{2\pi} x / \sqrt{w^2 - x^2} \quad \text{for } -w + d/2 < x < w - d/2, \text{ and}$$

$$f_{edge} = 2 \epsilon_0 - \frac{H\phi_0}{2\pi} \sqrt{4w/d - 1} \quad \text{for } x > w - d/2, \text{ and}$$

$$-f_{edge} \text{ for } x < -w + d/2.$$

Thus, the geometrical barrier opposes the entry of the vortices at the edge of the superconductor; but once they move inside, it moves them toward the center of the superconductor. For successful vortex removal the ratchet effect has to be strong enough to move the vortices against $f_{in}(x)$. In FIG. 3B the $(f_L,T)$ diagram describes the effectiveness of the ratchet effect as a function of the parameters characterizing the driving current, $f_L$. The gray scale code corresponds to the relative vortex density $\rho/\rho$ where $\rho$ is the initial vortex density corresponding to H=1G and $\rho$ is the final vortex density after the application of the AC current. As the gray scale code indicates, there is a region where vortex removal is complete, the vortex density being equal to zero. The dashed lines correspond to the $T_1$ and $T_2$ boundaries, which are calculated analytically and separate into the three main regimes: I: complete vortex removal in the majority of the regime, $\rho=0$; II: partial vortex removal, $0 \leq \rho < \rho_0$; and III: no change in the vortex density, $\rho=\rho_0$.

The $(f_L,T)$ diagram shown in FIG. 3B therefore has three major regimes separated by two boundaries. The $T_1=2\eta l_1/(f_L-(f_1+f_{in}(-w+l_2)))$ phase boundary (here we assume $d/2 < l_2$ and $f_{in}(x)$ is defined by FIGS. 3A and 3B) provides the time needed to move the vortex all the way up on the $l_1$ long facet of the ratchet potential at the edge of the superconductor, i.e., to remove the vortex from superconductor. When $T<T_1$ the vortices cannot exit the superconductor. Thus, $$T_2 = 2\eta \left( \frac{d/2}{f_L - [f_2 + f_{edge}]} + \frac{l_2 - d/2}{f_L - [f_2 - f_{in}(-w+d/2)]} \right)$$

phase boundary is the time needed for a vortex to enter from the edge of the superconductor past the first potential maxima, i.e., when $T<T_2$ the vortices cannot overcome the edge of the potential barrier (in calculating $T_2$ we assumed $d \approx l_2$, for $f_{edge}$ as shown in FIG. 3A). These phase boundaries, calculated for non-interacting vortices, effectively determine the vortex density in the three phases. Vortex removal is most effective in regime I, where the vortices cannot move past the first potential barrier when they try to enter the superconductor, but they get past the barriers opposing their exit from the superconductor. Thus, the vortices are swept out of the superconductor by the ratchet effect, and no vortex can reenter, leading to a vortex density $\rho=0$. Indeed, we find that the numerical simulations indicate complete vortex removal in the majority of this phase. An exception is the high $\rho$ finger structure near the crossing of the $T_1$ and $T_2$ boundaries, where due to resonance effects the vortices are trapped inside the superconductor. In regime II vortices can enter the superconductor, but the ratchet effect is still sweeping them out. We thus expect partial removal of the vortices with the final vortex density inside the superconductor determined by the balance of vortex nucleation rate at the edge of the sample (which depends on the surface properties of the superconductor) and the ratchet velocity moving them out. In regime III the vortices cannot leave the superconductor and new vortices cannot enter the system; therefore, the initial density inside the superconductor is unchanged throughout this phase ($\rho=\rho_0$).

Since $f_{in}^{max}$ and $f_{edge}$ depend on H, the position of the phase boundaries $T_1$ and $T_2$ also depends on the external magnetic field. In particular, there exists a critical field H* such that for H>H* regime I, where vortex removal is complete, disappears, but regime II with partial vortex removal does survive. We find that for Nb films of geometry described in the captions FIGS. 3A and 3C we have H*=10. However, since H* is a consequence of the geometric barrier, its value can be modified by changing the aspect ratio of the film. Furthermore, for superconductors with an elliptic cross-section the geometric barrier can be eliminated; thus, phase I with complete vortex removal can be extended to high magnetic fields as well.

Vortex removal is important for numerous superconductor applications and can improve the functioning of several devices. An immediate application of the proposed method can be improving the operation of superconducting quantum interference devices (SQUIDs), which are used as sensors in a wide assortment of scientific instruments, including magnetometers, gradiometers, sceptometers, voltmeters, radio frequency amplifiers, gravity wave antennas and gravity gradiometers. A long-standing issue in the performance of SQUIDs is 1/f noise arising from the activated hopping of trapped vortices. Reducing the vortex density in these superconductors is expected to extend the operation regime of these devices to lower frequencies. This is critical, for example, in improved monitoring of heart and brain function for which frequencies $\leq$ one Hz are important.

The invention can also facilitate the application of high $T_c$ superconductors in other areas, where the high vortex density has not allowed successful operation. Examples of applications that are limited by the presence of itinerant vortices and the associate dissipation include, but are not limited to, the product of high $T_c$ magnets, wires, and various quantum devices. Thus the invention could find strong application for numerous existing superconductor materials and technologies, as well as those under development.

A particularly attractive feature of the method of the invention is that it does not require sophisticated materials processing to make it work: First, it requires standard few-micron scale patterning techniques (the micrometer tooth size was chosen so that a few teeth fit on a typical SQUID, but larger feature size will also function if the period T is increased proportionally). Second, the application of an AC current with appropriate period and intensity is rather easy to achieve. For applications where an AC current is not desired, the vortices can be flushed out before the normal operation of the device. On the other hand, if the superconducting device is driven by an AC current (e.g., rf SQUIDs, AC magnets, or wires carrying AC current), the elimination of the vortices will take place continuously during the operation of the device. The analytically predicted phase boundaries, whose position is determined by the geometry of the patterning, provide a useful tool for designing the appropriate patterning to obtain the lowest possible vortex density for current and frequency ranges desired for specific applications. Finally, although here we describe preferred embodiments in the context of low temperature superconductors, the working principle of the ratchet effect applies to high temperature superconductors as well.

While preferred embodiments of the invention have been shown and described, it will be apparent to those skilled in the art that various changes and modifications can be made without departing from the invention in its broader aspects.

What is claimed is:

1. A method of substantially removing unwanted low density magnetic flux from a superconductor, comprising the steps of:

generating a controllable flux vortex pinning potential;

determining a desired flux vortex pinning potential optimized for removing unwanted low density magnetic flux from a superconductor;

applying an AC electric field with optimized magnitude and frequency to the superconductor; and sweeping out the unwanted low density magnetic flux to substantially remove the unwanted magnetic flux.

2. The method as defined in claim 1 wherein the flux vortex pinning potential includes an asymmetric component.

3. The method as defined in claim 2 wherein the flux vortex pinning potential includes a translationally invariant potential along one axis.

4. The method as defined in claim 1 wherein the flux vortex pinning potential comprises at least one of a smoothly varying asymmetric potential and a discontinuous asymmetric potential.

5. The method as defined in claim 1 wherein the AC electric field is applied at a minimum ratchet velocity.

6. The method as defined in claim 1 wherein the electric field potential comprises a plurality of field components, each of the components moving magnetic field vortices in a direction different than another.

7. The method as defined in claim 1 wherein the applied electric field results in a Lorentz force, $f_L$, acting on vortices in a certain direction only for a time period, T, in a combination to minimize the resultant vortex density in the superconductor.

8. The method as defined in claim 7 wherein the superconductor includes an elliptical cross section for elimination of geometric barriers for vortex removal.

9. The method as defined in claim 1 wherein the magnetic flux is removed from high $T_c$ magnets, wires and quantum devices.

10. The method as defined in claim 1 wherein an AC current drives the superconductor, and removal of the unwanted magnetic flux is continuous during applying the electric field potential.

11. The method as defined in claim 1 wherein the superconductor is selected from the group consisting of a low temperature and a high temperature superconductor.

12. The method as defined in claim 1 wherein the flux vortex pinning potential includes a combination of asymmetry and magnitude of potential to exceed a force, $f_{in}(x)$ defined by $$f_{in}(x) = \frac{-H\phi_0}{2\pi} x(w^2 - x^2)^{1/2}$$

for $-w+d/2\pi < x < w-d/2$.

13. The method as defined in claim 1 wherein a phase boundary defined by $T_2$ should be exceeded where, $$T_2 = 2\eta\left(\frac{d/2}{f_L - [f_2 + f_{edge}]} + \frac{l_2 - d/2}{f_L - [f_2 - f_{in}(-w+d/2)]}\right).$$

14. A device for removing unwanted low density magnetic flux from a superconductor, comprising:

a source of controllable flux vortex pinning potential;

computer means to determine an applied flux vortex pinning potential attribute optimized to remove the unwanted low density magnetic flux from the superconductor; and a control system to apply to the superconductor the flux vortex pinning potential having the attribute for optimized removal of a substantial portion of the unwanted low density magnetic flux.

* * * * *

UNITED STATES PATENT AND TRADEMARK OFFICE
CERTIFICATE OF CORRECTION

PATENT NO. : 6,469,880 B1
DATED : October 22, 2002
INVENTOR(S) : Barabasi et al.

It is certified that error appears in the above-identified patent and that said Letters Patent is hereby corrected as shown below:

Column 1,
Lines 67 and 68, "601125,706" should be -- 60/125,706 --.

Column 2,
Line 48, "J+" should be -- Jx --.

Column 3,
Line 49, "$\rho$," should be -- $\rho_o$, --.
Beginning of last stand alone equation "$f_w$" should be -- $f_{vv}$ --.

Column 5,
Line 7, "$\rho/\rho$, where $\rho$ is" should be -- $\rho/\rho_o$, where $\rho_o$ is --.

Signed and Sealed this

Seventeenth Day of June, 2003

JAMES E. ROGAN
*Director of the United States Patent and Trademark Office*